United States Patent [19]
Allen et al.

[11] Patent Number: 6,023,422
[45] Date of Patent: Feb. 8, 2000

[54] METHOD FOR CHANGING THE WEIGHT OF A SYNAPTIC ELEMENT

[75] Inventors: Timothy P. Allen, Los Gatos; James B. Cser, Santa Clara, both of Calif.

[73] Assignee: Synaptics, Inc., San Jose, Calif.

[21] Appl. No.: 09/163,229

[22] Filed: Sep. 29, 1998

Related U.S. Application Data

[62] Division of application No. 08/570,268, Dec. 11, 1995, Pat. No. 5,864,242.

[51] Int. Cl.$^7$ .................................................. G11C 16/04
[52] U.S. Cl. ................. 365/185.03; 365/45; 365/185.27; 327/525
[58] Field of Search .................................. 365/45, 185.03, 365/185.01, 185.27; 257/320; 327/525; 326/44, 38

[56] References Cited

U.S. PATENT DOCUMENTS

| | | | |
|---|---|---|---|
| 4,432,075 | 2/1984 | Eitan | 365/185 |
| 4,493,058 | 1/1985 | Adam | 365/189 |
| 4,803,529 | 2/1989 | Masuoka | 357/23.5 |
| 4,904,881 | 2/1990 | Castro | 307/201 |
| 4,961,002 | 10/1990 | Tam et al. | 307/201 |
| 5,028,810 | 7/1991 | Castro et al. | 307/201 |
| 5,034,918 | 7/1991 | Jeong | 365/49 |
| 5,095,461 | 3/1992 | Miyakawa et al. | 365/185 |
| 5,166,562 | 11/1992 | Allen et al. | 307/571 |
| 5,291,439 | 3/1994 | Kauffmann et al. | 365/185 |
| 5,336,936 | 8/1994 | Allen et al. | 307/201 |

*Primary Examiner*—Son T. Dinh
*Attorney, Agent, or Firm*—D'Alessandro & Ritchie

[57] ABSTRACT

An analog storage array according to the present invention is disposed on a semiconductor substrate. The array is arranged as a plurality of rows and a plurality of columns and includes a plurality of N-channel MOS transistors disposed in the rows and columns in a p-well in the semiconductor substrate. Each of the MOS transistors includes a source, a drain, and a floating gate forming a tunneling junction with a tunneling electrode. An input line is associated with each of the rows in the array. Each input line is connected to the source of each of the N-channel MOS transistors disposed in the row with which the input line is associated. A bias line is associated with each of the rows in the array. Each bias line is capacitively coupled to the floating gate of each of the N-channel MOS transistors disposed in the row with which the bias line is associated. A tunnel line is associated with each of the columns in the array. Each tunnel line connected to the tunneling electrode of each of the N-channel MOS transistors disposed in the column with which the bias line is associated. A current-sum line is associated with each of the columns in the array. Each current-sum line is connected to the drain of each of the N-channel MOS transistors disposed in the column with which the bias line is associated. Circuitry is provided for forward biasing said p-well with respect to the substrate. Circuitry is provided for simultaneously driving a selected one of the bias lines low while driving a selected one of the tunnel lines high, for raising the floating gate voltage of the one of the N-channel MOS transistors common to the selected one of the bias lines and the selected one of the tunnel lines.

11 Claims, 8 Drawing Sheets

| | TUN | D_H | D_L |
|---|---|---|---|
| TUNNEL | 5V | 5V | 5V |
| INJECT | 0 | 0 | 0 |
| NORMAL | 0 | 5V | 0 |

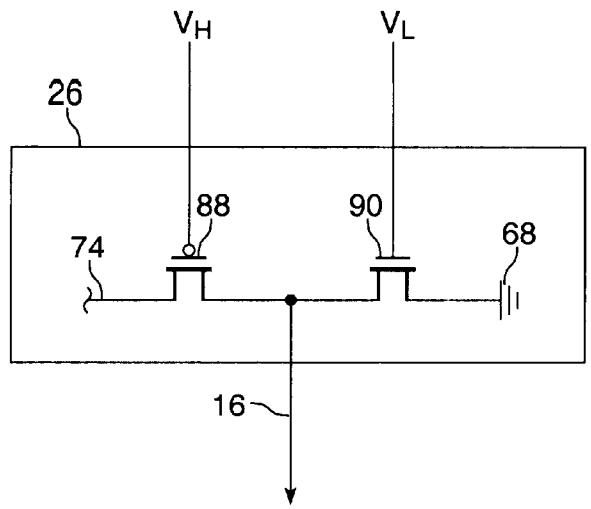
FIG. 7A
|  | $V_H$ | $V_L$ |
|---|---|---|
| TUNNEL | 5V | 5V |
| INJECT | 0 | 0 |
| NORMAL | 5V | 0 |
FIG. 7B
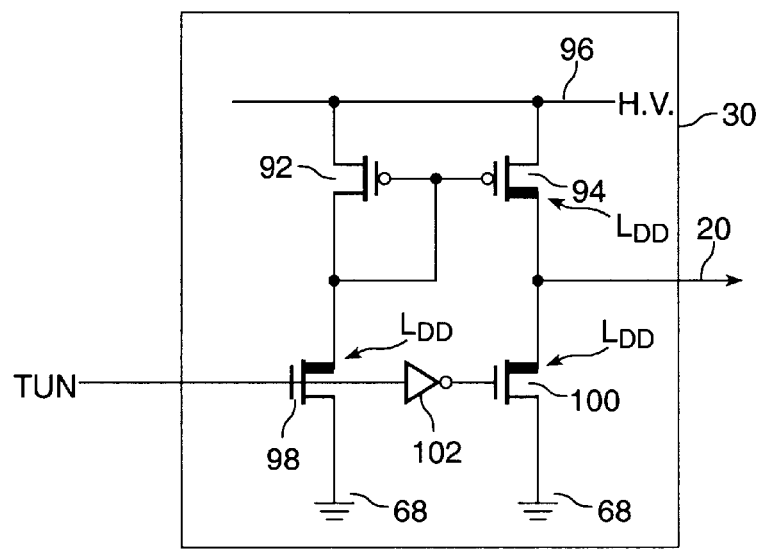
FIG. 8

METHOD FOR CHANGING THE WEIGHT OF A SYNAPTIC ELEMENT

This is a division of Ser. No. 08/570,268, filed Dec. 11, 1995 now U.S. Pat. No. 5,864,242.

BACKGROUND OF THE INVENTION

1. Field of the Invention

The present invention relates to analog storage elements and arrays generally. More particularly, the present invention relates to an adaptable one-transistor analog storage element and an adaptable analog storage array comprising a plurality of one-transistor analog storage elements.

2. The Prior Art

Floating gate MOS transistors have been utilized in digital memory applications for over a decade. More recently, floating gate MOS technology has found use in analog applications. For example, in U.S. Pat. Nos. 4,890,259 and 4,989,179, analog floating gate devices are employed in an analog signal recording and playback system.

Many schemes have been proposed to use floating gate structures as weight storage for analog neural networks. Any such network requires a synaptic update mechanism which allows the weight to be changed depending on the combination of an input signal and an error signal. The desirable properties of such an update mechanism when implemented in an analog integrated circuit are small size, ability to work continuously (i.e., to use the signal while it is being updated), and freedom from high-voltage circuitry requirements within the synapse cell itself. The learning rate of such an update mechanism should not vary widely between circuits on the same chip.

In U.S. Pat. Nos. 4,935,702, and 5,068,622 to Mead et al., floating gate technology is used to control random offsets in analog amplifier elements. In U.S. Pat. No. 4,953,928 to Anderson et al., analog floating gates are employed in devices for performing the long term learning function. In U.S. Pat. No. 5,059,920 to Anderson et al., analog floating gates are employed in conjunction with devices containing electron injection and tunneling structures for performing an electrical learning function. In U.S. Pat. No. 5,083,044 to Mead et al., a synaptic element and array employ analog floating gate technology.

The prior art described in U.S. Pat. No. 5,059,920, and developed more recently by Mead et al. in co-pending application Ser. No. 07/805,324, filed Dec. 10, 1991, required rather complex structures occupying considerable area on the silicon surface. It would be desirable to further improve upon the devices disclosed in these references by providing similar functionality in structures utilizing less integrated circuit area per synapse.

Accordingly, it is an object of the present invention to provide a one-transistor synapse in a neural network.

It is a further object of the present invention to provide an array of synaptic elements, each containing only one transistor, the floating gate of any of which elements can be selectively either increased or decreased without appreciably disturbing the weights of other elements in the array.

A further object of the present invention is to provide a neural network including a plurality of synapses which occupies a smaller area than possible with prior art arrays.

This and other objects of the invention will be apparent to any person of ordinary skill in the art from the description of the invention contained herein.

BRIEF DESCRIPTION OF THE INVENTION

According to a first aspect of the present invention, a one-transistor analog synaptic element comprises an N-channel MOS transistor including a source, a drain, and a floating gate forming a tunneling junction with a tunneling electrode. The single transistor synapse is preferably disposed in a p-well in an n-type substrate and can be biased such that electrons may be both placed onto and removed from the floating gate.

According to a second aspect of the present invention, a synaptic array of one-transistor analog synaptic elements according to the present invention are disposed on a semiconductor substrate. The array is arranged as a plurality of rows and a plurality of columns and includes a plurality of N-channel MOS transistors disposed in the rows and columns in a p-type semiconductor substrate, which may comprise a p-well in an n-type semiconductor substrate. Each of the MOS transistors includes a source, a drain, and a floating gate. The floating gate forms a tunneling junction with a tunneling electrode.

An input line is associated with each of the rows in the array. Each input line is connected to the source of each of the N-channel MOS transistors disposed in the row with which the input line is associated.

A bias line is associated with each of the rows in the array. Each bias line is capacitively coupled to the floating gate of each of the N-channel MOS transistors disposed in the row with which the bias line is associated.

A tunnel line is associated with each of the columns in the array. Each tunnel line is connected to the tunneling electrode of each of the N-channel MOS transistors disposed in the column with which the tunnel line is associated.

A current-sum line is associated with each of the columns in the array. Each current-sum line is connected to the drain of each of the N-channel MOS transistors disposed in the column with which the current-sum line is associated.

Means are provided for simultaneously driving one or more of the bias lines low while driving one or more of the tunnel lines high, for raising the floating gate voltage of the one or more of the N-channel MOS transistors common to the selected bias lines and the selected tunnel lines. In this way, tunneling may be induced at one or more of the tunneling junctions.

Means are provided for forward biasing the substrate with respect to the well to cause minority electrons to be injected into the p-well and to a depletion layer associated with the active regions of the N-channel MOS transistors, and for selectively raising the drain and source voltages of one or more of the transistors to accelerate the injected electrons enough to enable them to enter the gate oxide and migrate onto the floating gate.

BRIEF DESCRIPTION OF THE DRAWINGS

FIG. 7a is a schematic diagram of an illustrative column-programming circuit for use in the array of the present invention.

FIG. 7b is a table showing the control node states of the circuit of FIG. 7a for enabling the various functional modes of the column-programming circuit.

FIG. 8 is a schematic diagram of an illustrative high-voltage driver circuit for use in the array of the present invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. More specifically, the structure and method of the present invention has been disclosed in the illustrative context of a synaptic element and array. Those of ordinary skill in the art will recognize that the present invention is generally applicable to other analog storage applications.

Figure 1:
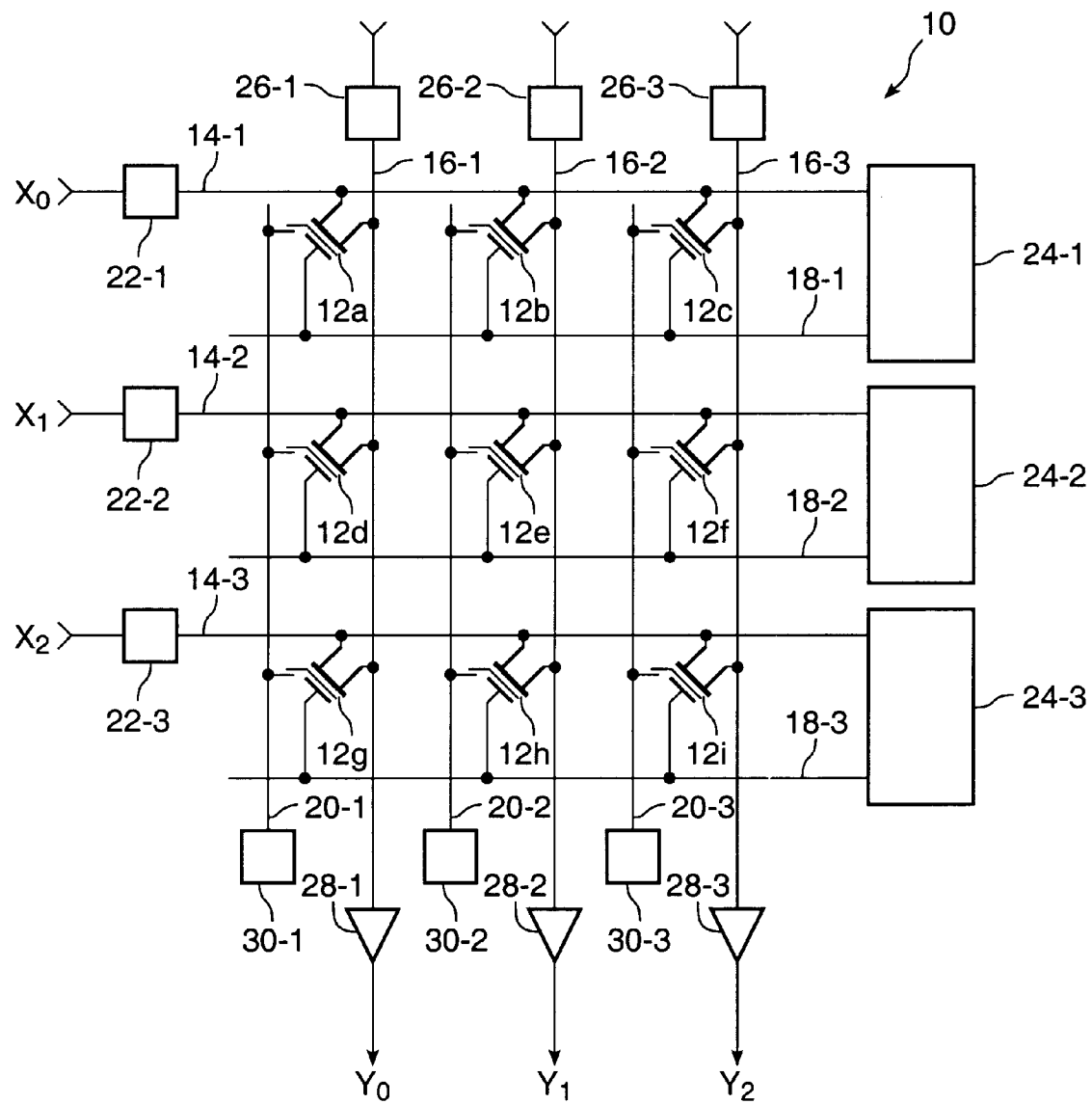
FIG. 1 is a schematic representation of a synaptic array including single N-channel MOS transistor synaptic elements according to a presently preferred embodiment of the invention.

Referring first to FIG. 1, a synaptic array according to the present invention is shown. Array 10 comprises a plurality of N-channel floating gate transistors arranged as a plurality of rows and columns. While the array of FIG. 1 is shown including nine N-channel floating gate transistors 12a–12i, those of ordinary skill in the art will recognize that the array of FIG. 1 is drawn to illustrate the principles of the invention and that actual arrays fabricated according to the teachings herein may contain an arbitrary number of elements.

MOS floating gate transistors 12a–12i are arranged in an array of three rows and three columns. Array 10 is traversed by row lines 14-1 to 14-3, column-sum lines 16-1 to 16-3, gate-reference lines 18-1 to 18-3, and tunneling-control lines 20-1 to 20-3. Each of row lines 14-1 to 14-3 is connected to the sources of the MOS floating gate transistors in its row. Thus, row line 14-1 is connected to the sources of MOS floating gate transistors 12a, 12b, and 12c; row line 14-2 is connected to the sources of MOS floating gate transistors 12d, 12e, and 12f; and row line 14-3 is connected to the sources of MOS floating gate transistors 12g, 12h, and 12i. Each row line 14-1 to 14-3 is driven by a corresponding input driver circuit 22-1 to 22-3, respectively, and by a row-programming driver circuit 24-1 to 24-3, respectively.

Each of column-sum lines 16-1 to 16-3 is connected to the drains of the MOS floating gate transistors in its column. Thus, column-sum line 16-1 is connected to the drains of MOS floating gate transistors 12a, 12d, and 12g; column-sum line 16-2 is connected to the drains of MOS floating gate transistors 12b, 12e, and 12h; and column-sum line 16-3 is connected to the drains of MOS floating gate transistors 12c, 12f, and 12i. Each column-sum line 16-1 to 16-3 is driven by a corresponding column-programming driver circuit 26-1 to 26-3, respectively, and drives a current sense amplifier circuit 28-1 to 28-3, respectively. Numerous current sense amplifier circuits are useful for employment in the array of the present invention. As presently preferred, sense amplifiers such as those disclosed in allowed co-pending application Ser. No. 07/746,962, filed Aug. 19, 1991, may be used in the present invention. This co-pending application is expressly incorporated herein by reference.

Each of gate-reference lines 18-1 to 18-3 is capacitively coupled to the gates of the MOS floating gate transistors in its row. Thus, gate-reference line 18-1 is capacitively coupled to the gates of MOS floating gate transistors 12a, 12b, and 12c; gate-reference line 18-2 is capacitively coupled to the gates of MOS floating gate transistors 12d, 12e, and 12f; and gate-reference line 18-3 is capacitively coupled to the gates of MOS floating gate transistors 12g, 12h, and 12i. Each gate-reference line 18-1 to 18-3 is driven by row.1 programming driver circuit 24-1 to 24-3, respectively.

Each of tunneling-control lines 20-1 to 20-3 is connected to tunneling junctions associated with the floating gates of the MOS floating gate transistors in its column. Thus, tunneling-control line 20-1 is connected to the tunneling junctions of MOS floating gate transistors 12a, 12d, and 12g; tunneling-control line 20-2 is connected to the tunneling junctions of MOS floating gate transistors 12b, 12e, and 12h; and tunneling-control line 20-3 is connected to the tunneling junctions of MOS floating gate transistors 12c, 12f, and 12i. Each tunneling line 20-1 to 20-3 is driven by a high voltage driver circuit 30-1 to 30-3, respectively.

A vector of analog input voltages x0 . . . x2 are conditioned, normalized, and driven onto row lines 14-1 to 14-3 by input driver circuits 22-1 to 22-3, respectively. In normal operation, in response to the inputs, the network produces a set of outputs on column-sum lines 16-1 to 16-3. These outputs are computed, according to the standard neural network paradigm, by multiplying each input voltage by a weight value, and summing all of these products associated with a particular column ("neuron") in a summing element, and passing the sum through a nonlinear ("soma") element.

Weights are stored in the synaptic array on the floating gates of the synapse transistors. The floating gate voltage in each synaptic element creates an output current proportional to the product of the input line voltage and the stored synaptic weight value. Currents from all transistors in the columns are summed on column-sum lines 16-1 to 16-3, respectively, forming the "dendrite" of the "neuron", and the total current in each column sensed by current-sense amplifiers 28-1 to 28-3, respectively in the "soma" of that column. Gate reference lines 18-1 to 18-3 are held at a constant voltage of about 2 volts by driver circuits 24-1 to 24-3, which are disabled from driving row lines 14-1 to 14-3. During normal operation, high voltage driver circuits 30-1 to 30-3 hold tunneling lines 20-1 to 20-3 at a voltage well below that required for appreciable electron tunneling. Column driver circuits 26-1 to 26-3 are disabled during normal operation of the array.

Figure 2:
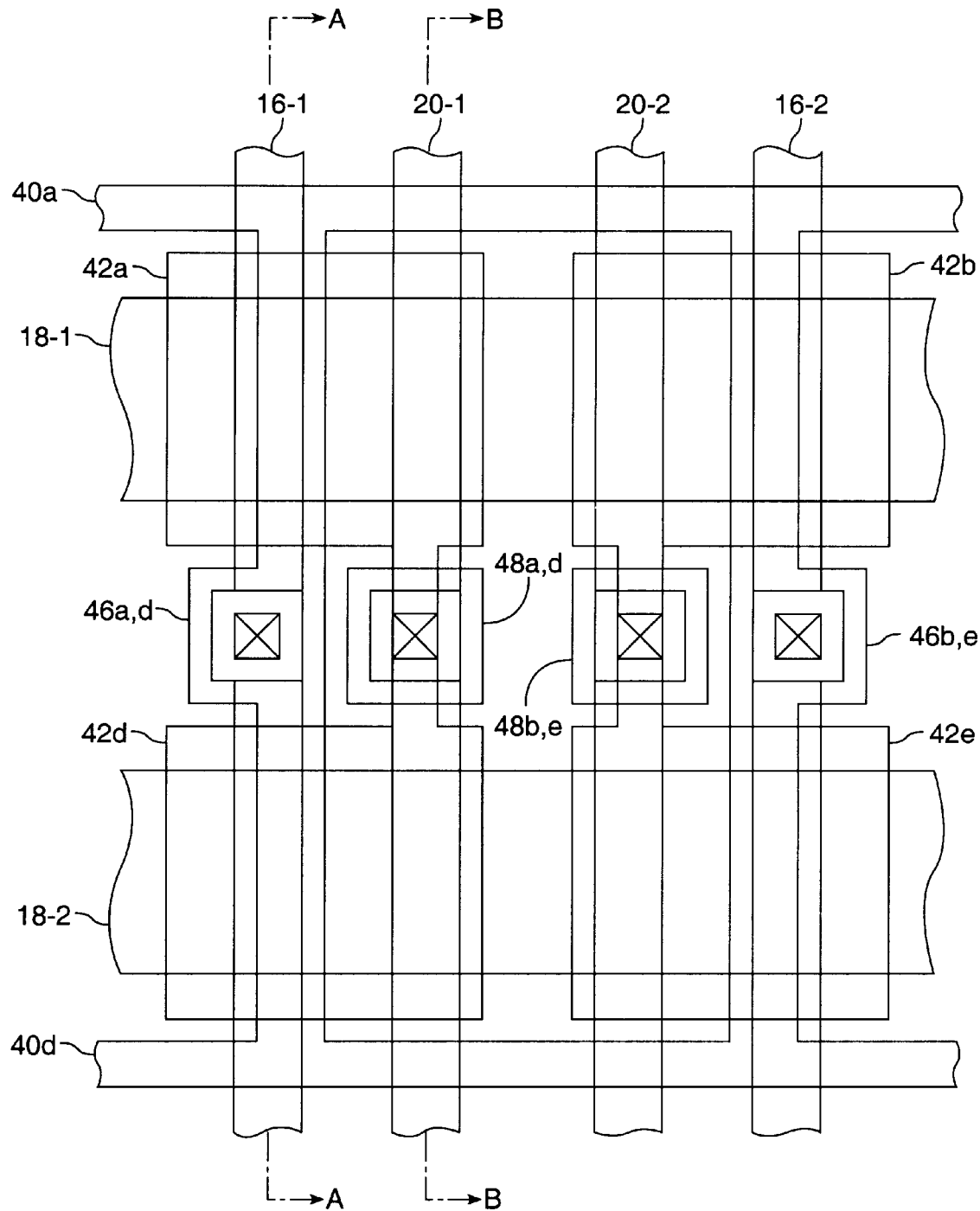
FIG. 2 is a top view of a circuit layout for the upper-left portion of the synaptic array of FIG. 1, containing the first two rows and the first two columns of synaptic elements.
Figure 3:
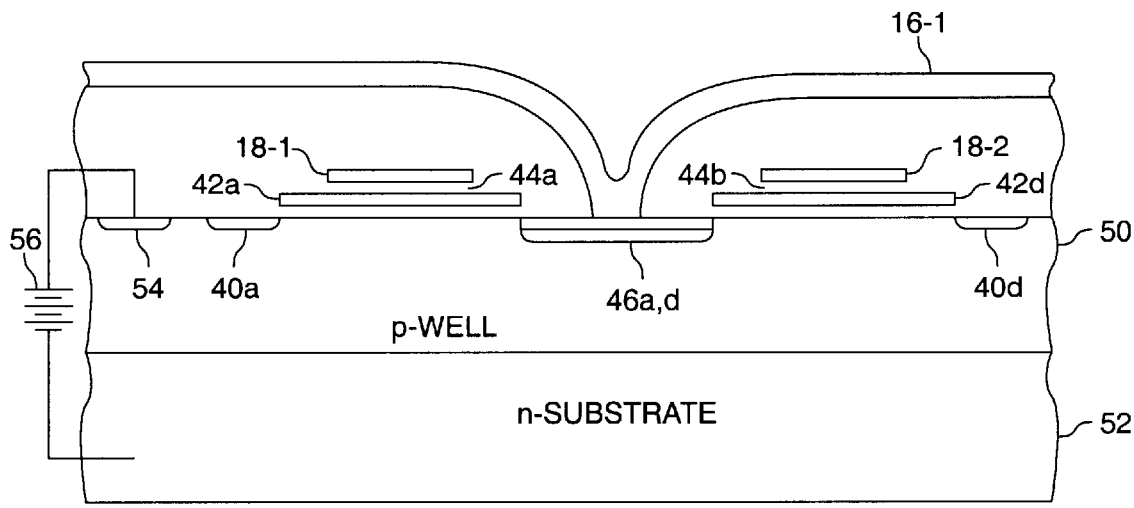
FIG. 3 is a cross-section of the layout of FIG. 2, taken through the line A—A in the array of FIG. 2.
Figure 4:
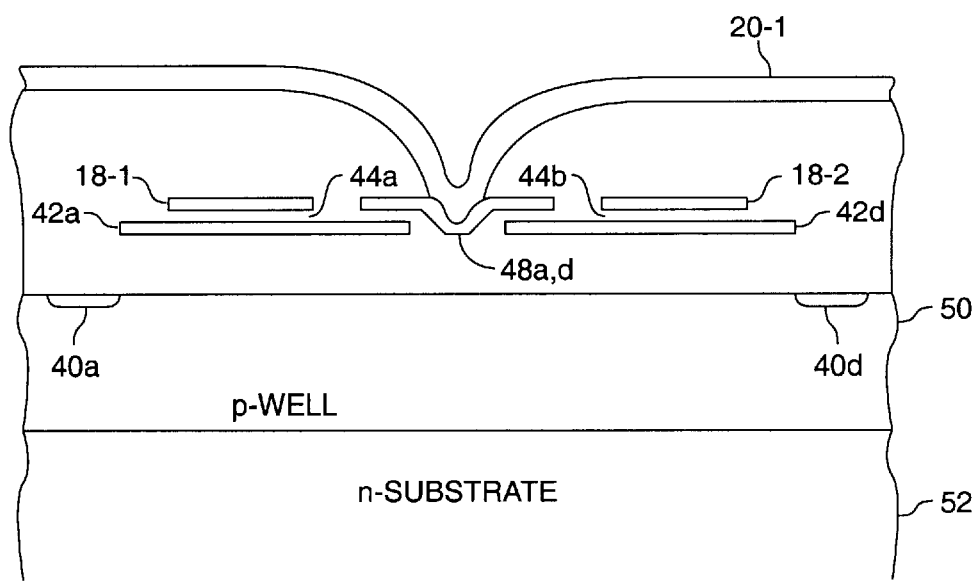
FIG. 4 is a cross section of the layout of FIG. 2, taken through the line B—B in the array of FIG. 2.

FIG. 2 presents a top view of a physical layout of the upper-left portion of the synaptic array of FIG. 1, containing the first two rows and the first two columns of synaptic elements. FIG. 2 shows the synapses comprising MOS floating gate transistors 12a, 12b, 12d, and 12e. FIG. 3 is a cross-section through lines A—A in FIG. 2 and shows a portion of the synapses comprising MOS floating gate transistors 12a and 12d. FIG. 4 is a cross section through lines B—B in FIG. 2 and shows another portion of the synapses comprising MOS floating gate transistors 12a and 12d. The structure and operation of the array can be better understood with reference to FIGS. 2–4. For clarity, the reference numeral suffixes a–i will be used in FIGS. 2–4 to identify elements of transistors 12a–12i, respectively.

Referring now to FIGS. 2–4, row line 14-1 (FIG. 1) is implemented as an n+ diffused region 40a, which forms the source of N-channel MOS floating gate transistor 12a. The gate of this transistor is formed by a first-level polysilicon region 42a, which is capacitively coupled to gate reference line 18-1, formed from a second level polysilicon layer, and separated from floating gate 42a by a thin layer of inter-poly oxide 44a formed thereon by thermal oxidation, as is well known by those skilled in the art. The drain of N-channel MOS floating gate transistor 12a and N-channel MOS floating gate transistor 12d are jointly formed by n+ diffused region 46a,d, which is connected to metal column line 16-1 by a contact cut. Similarly, n+ diffused region 40d forms the source of N-channel MOS floating gate transistor 12d. The gate of this transistor is formed by a first-level polysilicon region 42d, which is capacitively coupled to gate reference line 18-2, also formed from a second level polysilicon layer, and separated from floating gate 42d by a thin layer of inter-poly oxide 44d. For large arrays, the resistance of row lines 14-1 to 14-3 may be excessive, and it will be desirable to connect or "stitch" them periodically to second-level metal row lines to reduce their resistance. Such optimizations are commonly employed in MOS circuit structures, will readily occur to those skilled in the art, and will not be described in detail.

Because the cross section illustrated in FIG. 4 is taken through an area not covered by the active-layer mask, polysilicon floating gate 42a of N-channel MOS floating gate transistor 12a and polysilicon gate 42d of N-channel MOS floating gate transistor 12d are separated from the silicon surface by a thick field oxide in this region. A second-level polysilicon tunneling node 48a,d overlaps both floating gates 42a and 42d and is separated therefrom by thin inter-poly oxide. Tunneling node 48a,d forms the tunneling junctions of both transistors 12a and 12d, and is connected to metal tunneling line 20-1 by a contact cut.

In both FIG. 3 and FIG. 4, it can be seen that the synaptic structure is formed on a p-type well 50 formed in an n-type silicon substrate 52, which may or may not itself be an n-type well in a p-type substrate. Those of ordinary skill in the art will recognize that the particular structure to employ will be a matter of design choice.

When it is desired to program the weights, electron tunneling can be used to increase the weight (make floating gate more positive), and hot-electron injection can be used to decrease the weight (make floating gate more negative). These charge transport mechanisms are fully described in U.S. Pat. No. 5,059,520. The prior art teachings in this patent, and developed more recently in U.S. Pat. No. 5,083,044 to Mead et al., required a rather complex structure occupying considerable area on the silicon surface. The present invention provides an array of synaptic elements, each containing a far simpler structure comprising only one MOS transistor, the floating gate of which can be selectively either increased or decreased without disturbing the weights of other elements in the array.

Figure 10:
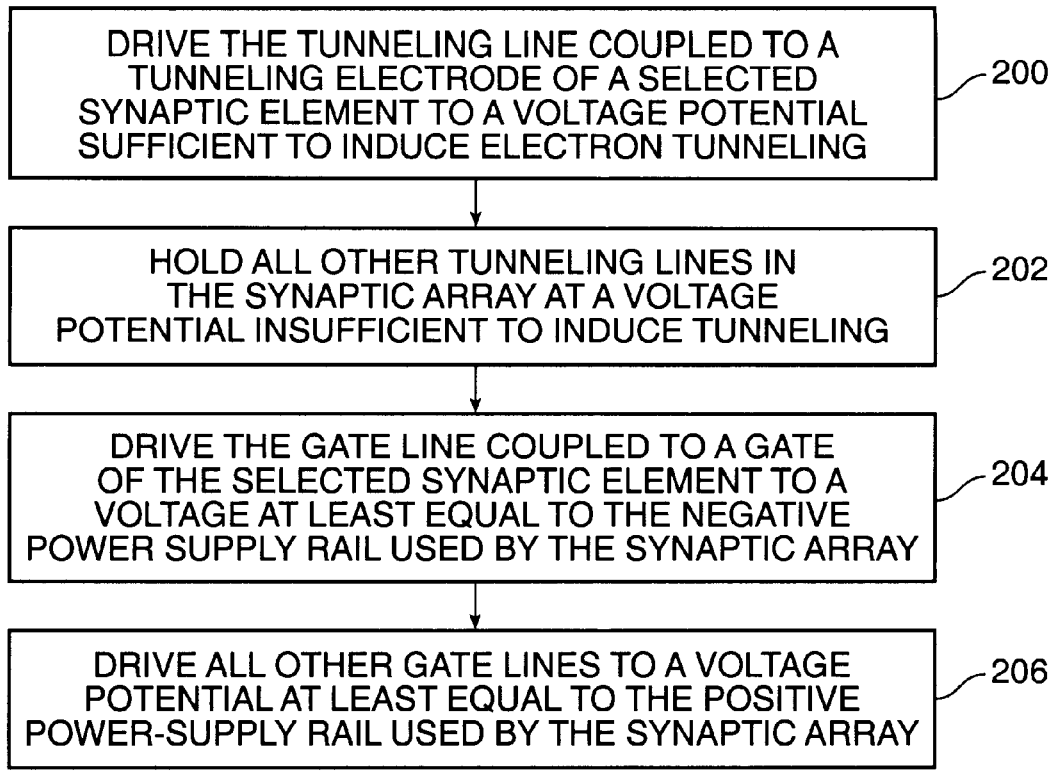
FIG. 10 includes the acts necessary to increase the weight of a synaptic element comprising a MOS floating gate transistor in accordance with one embodiment of the present invention.
Figure 11:
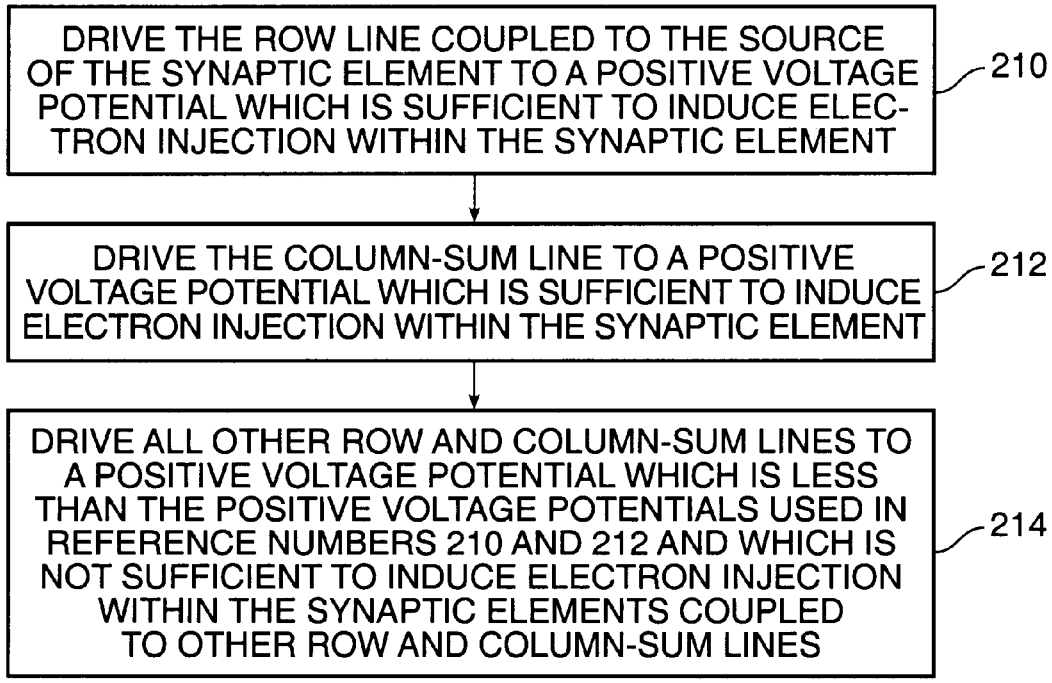
FIG. 11 includes the acts necessary to decrease the weight of a synaptic element comprising a MOS floating gate transistor in accordance with another embodiment of the present invention.

To increase the weight of the synapse comprising MOS floating gate transistor 12a, it is desired to make floating gate 42a more positive. This is accomplished by removing electrons from floating gate 42a by tunneling to node 48a,d, without appreciably disturbing the charge stored on other floating gates in the array. At reference number 200 in FIG. 10, high-voltage driver 30-1 is enabled to drive tunneling line 20-1 to a voltage sufficient to induce electron tunneling. At reference number 202, all other tunneling lines are held at a lower voltage potential insufficient to induce tunneling. At reference number 204, gate reference line 18-1 is driven to the negative power-supply rail of the chip (usually the potential of the p-well 50) by row-programming driver circuit 24-1. At reference number, 206, all other row-programming driver circuits 24-2 and 24-3 are enabled to drive their respective gate-reference lines 18-2 and 18-3 to the positive power-supply rail of circuitry on the chip, which in 1992 technology is often +5 volts.

Under these conditions, the voltage across the thin inter-poly oxide between tunneling node 48a,d and floating gate 42a of MOS floating gate transistor 12a will be nearly the full tunneling voltage, while the voltage across the thin inter-poly oxide between tunneling node 48a,d and floating gate 42d will be driven high by capacitive coupling to positive gate-reference line 18-2. Because the tunneling current is an exponential function of the voltage across the oxide, electrons will tunnel from floating gate 42a many orders of magnitude faster than they will tunnel from other floating gates (in transistors 12d and 12g) in the same column. Floating gates in other columns (in transistors 12b, 12c, 12e, 12f, 12h, and 12i) will not tunnel because their respective tunneling nodes are being held at a low voltage.

To decrease the weight of the synapse comprising MOS floating gate transistor 12a, it is desired to make floating gate 42a more negative. This is accomplished by employing hot-electron injection, as described in U.S. Pat. No. 5,059,920. In the array described herein, the n-substrate 52 is forward biased with respect to p-well 50, causing minority electrons to be injected into p-well 50. These minority carriers diffuse throughout p-well 50, and eventually either recombine with majority electrons, or find their way into the depletion layer surrounding the n+ regions (40a, 40d and 46a,d in FIG. 3), or those n+ transistor active regions themselves shown under the floating gates 42a and 42d in FIG. 3.

Figure 9:
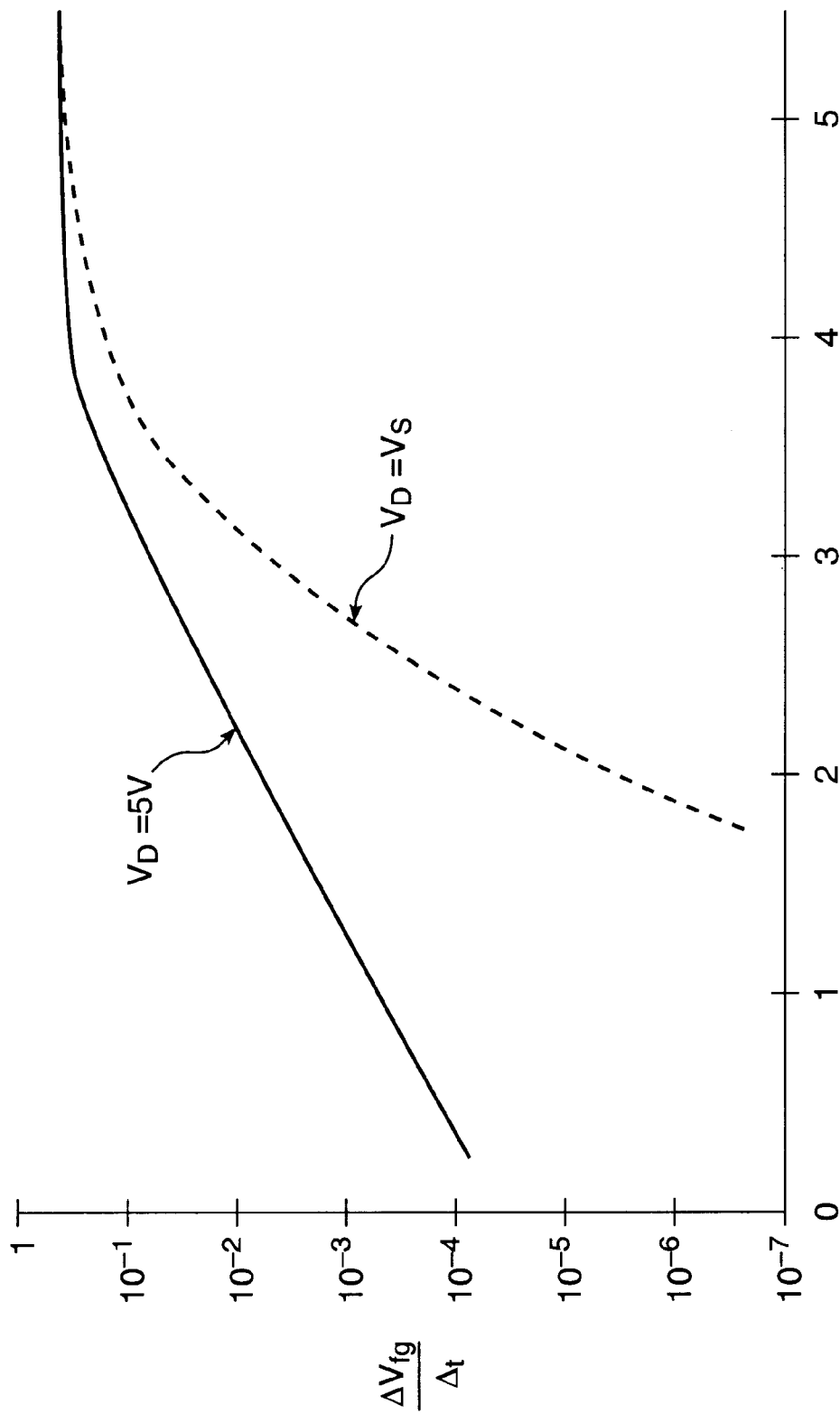
FIG. 9 is a graph showing the electron injection rate for an actual test array fabricated according to the present invention, measured as a function of source voltage.

Under the proper conditions, electrons entering the depletion layer can be accelerated enough to enable them to enter the gate oxide and migrate onto the floating gate. The rate at which electrons flow onto the floating gate is a function of both the source and drain voltage of the transistor. The injection rate for a particular test array was measured as a function of source voltage under two conditions: drain connected to +5 volts (solid curve) and drain connected to source (dashed curve). The results, plotted in FIG. 9, show that with both source and drain more positive than about +4 volts, maximum injection takes place. With either the source or the drain at 0 volts, the injection rate is reduced by a factor of more than ten thousand. With both source and drain less than about 1.5 volts, the injection rate is too small to be measured. The phenomenon illustrated in FIG. 5 can be used to selectively inject electrons onto one floating gate without appreciably affecting the charge on other floating gates.

To inject electrons onto floating gate 42a, row line 14-1 is driven high by row-programming driver 24-1, while input driver 22-1 is disabled (reference number 210). Simultaneously, column sum line 16-1 is driven high by column-programming driver 26-1 (reference number 212). All other row and column lines are driven low by their respective drivers (reference number 214). Under these conditions, the electron injection rate for floating gate 42a will be orders of magnitude larger than that for any other floating gate in the array. If it is desired to inject all floating gates at once, all row and column lines can be driven high at the same time. This mode can be used to "flash erase" the entire array, which can then be selectively programmed by tunneling.

Simple input driver circuits may be used in arrays configured according to the present invention. In addition, simple control circuits driven by a few control signals may be used to cause tunneling and electron injection to selected floating gates in the array.

Figure 5:
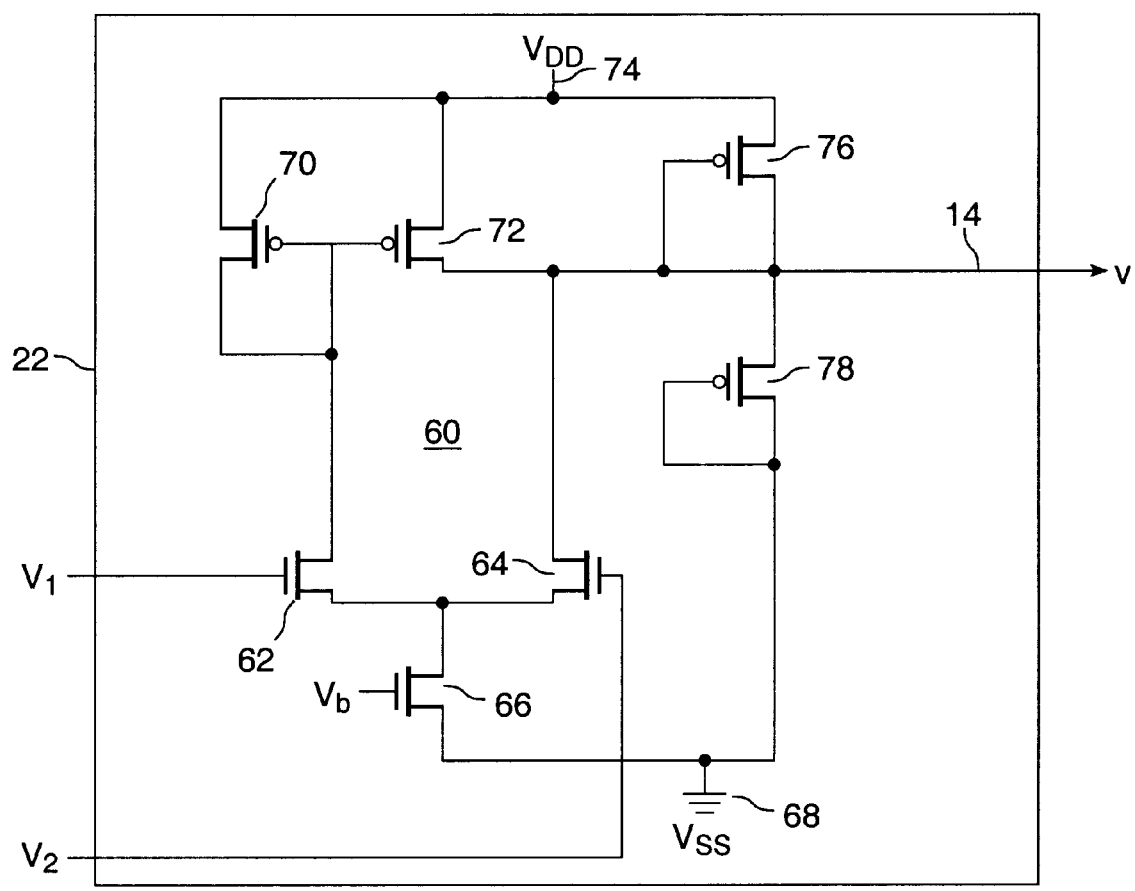
FIG. 5 is a schematic diagram of an illustrative input driver circuit for use in the array of the present invention.

Referring now to FIG. 5, a schematic diagram of a typical input driver circuit 22 suitable for use with the present invention is shown. The function of input driver circuits 22-1 to 22-3 in array 10 is to condition and normalize a vector of analog input voltages x0 . . . x2, and to drive the conditioned and normalized input voltage vector components onto row lines 14-1 to 14-3.

A simple driver circuit 22 useful in the present invention may comprise a transconductance amplifier circuit 60 including first and second N-channel MOS input transistors 62 and 64, having their gates connected to voltage input nodes for differential input potentials $V_1$ and $V_2$ and their sources commonly connected to the drain of an N-channel MOS bias transistor 66, having its source connected to a $V_{SS}$ voltage rail 68, such as ground, and its gate connected to a source of bias voltage $V_b$. The transconductance amplifier 60 operates as disclosed in Carver A. Mead, *Analog VLSI and Neural Systems*, pp. 70–71, Addison-Wesley Publishing Co. 1989. The drains of MOS input transistors 62 and 64 are connected to the drains of P-channel MOS current-mirror transistors 70 and 72, which have their sources connected to a $V_{DD}$ voltage rail 74. The circuit node comprising the common drain connection of MOS transistors 64 and 72 is the output node connected to one of the row lines 14-1 to 14-3 of the circuit of FIG. 1. This output node is shown connected to diode-connected MOS transistors 76 and 78. The diode-connected P-channel MOS transistors 76 and 78 perform three functions. First, they transform the input currents into voltages. Next, they scale down the input current by the factor $\exp[(V_H-k^2V_L)/(1-k)]$, where $V_H$ and $V_L$ are the supply rail voltages and k is a constant depending on the fabrication of transistors 76 and 78, usually equal to about 0.7, allowing the input lines to be strongly driven (fast) while still reliably generating small output currents. Third, they provide a "flat spot" for input currents less than the bias current, so that random offsets do not generate appreciable learning effects.

To operate the circuit of FIG. 5 in the present invention, the bias current of the differential pair of MOS transistors 62 and 64 should be set by $V_b$ to be greater than the bias current through transistors 76 and 78 (set by the voltage between voltage rails 68 and 74), otherwise, the synaptic current Iout could never become large enough for the multiplier action to operate properly.

Figures 6A, 6B:
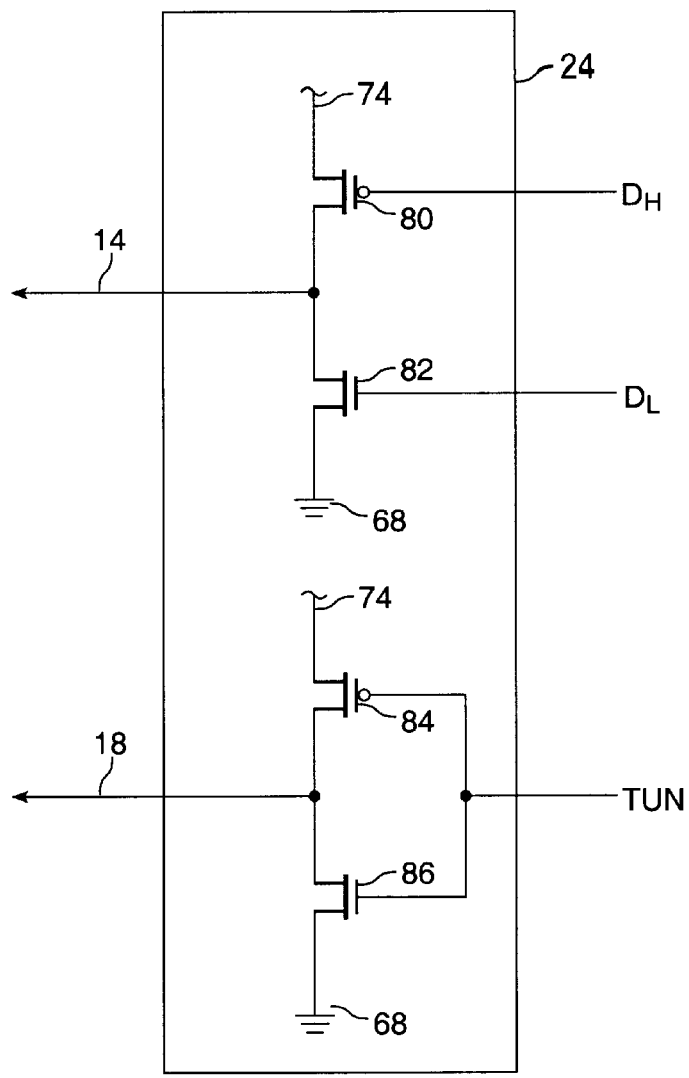
FIG. 6a is a schematic diagram of an illustrative row-programming circuit for use in the array of the present invention.
FIG. 6b is a table showing the control node states of the circuit of FIG. 6a for enabling the various functional modes of the row-programming circuit.

Referring now to FIG. 6a, a schematic diagram of a typical row-programming circuit 24 suitable for use with the present invention is shown. The function of row-programming circuits 24-1 to 24-3 in the array of FIG. 1 is to drive gate-reference lines 18-1 to 18-3 to appropriate normal operating voltages for normal array operation and to drive them to appropriate voltages for causing electron injection to floating gates of synapses connected to them or to partially select electron tunneling from the floating gates of synapses connected to them.

A first complementary pair of MOS transistors includes P-channel MOS transistor 80 and N-channel MOS transistor 82 connected in series between power supply rails 74 and 68, which may have a potential difference of 5 volts between them. The gate of P-channel MOS transistor 80 is connected to a control node $D_H$ and the gate of N-channel MOS transistor 82 is connected to a control node $D_L$. The common connection between the drains of P-channel MOS transistor 80 and N-channel MOS transistor 82 is connected to one of row lines 14-1 to 14-3.

A second complementary pair of MOS transistors includes P-channel MOS transistor 84 and N-channel MOS transistor 86 connected in series between power supply rails 68 and 74. The gates of P-channel MOS transistor 84 and N-channel MOS transistor 86 are connected together to a control node TUN. The common connection between the drains of P-channel MOS transistor 84 and N-channel MOS transistor 86 is connected to one of gate reference lines 18-1 to 18-3.

Referring now to FIG. 6b, a table shows the voltages which are to be applied to control nodes $D_H$, $D_L$, and TUN to achieve the various operating modes of the circuit. For normal circuit operation, control—node $D_H$ is held at a positive voltage potential of 5 volts, and control nodes $D_L$ and TUN are held at a potential of 0 volts. Under these conditions, both MOS transistors 80 and 82 are turned off and the state of the row line is thus controlled by the input driver circuit 22. MOS transistor 84 is turned on and MOS transistor 86 is turned off, thus holding the gate reference line at 5 volts.

For tunneling to take place, control nodes $D_H$, $D_L$ and TUN are all held at a positive voltage potential of 5 volts. Under these conditions, MOS transistor 80 is turned off and MOS transistor 82 is turned on. The row line will be held at a potential of zero volts. MOS transistor 84 is turned off and MOS transistor 86 is turned on, thus holding the gate reference line at 0 volts.

For injection to take place, control nodes $D_H$, $D_L$, and TUN are held at a voltage potential of 0 volts. Under these conditions, MOS transistor 80 is turned on and MOS transistor 82 is turned off, holding the row line at 5 volts. MOS transistor 84 is turned on and MOS transistor 86 is turned off, thus holding the gate reference line 18 at 5 volts. P-well 50 is forward biased with respect to substrate 52.

Referring now to FIG. 7a, a schematic diagram of a typical column-programming circuit 26 suitable for use with the present invention is shown. The function of column-programming circuits 26-1 to 26-3 in the array of FIG. 1 is to drive column lines 16-1 to 16-3 to appropriate voltages for normal array operation and to selectively drive them to high voltages to enable or to low voltages to disable the injecting of electrons onto the floating gates of the synapses to which they are connected. Column-programming circuit 26 may comprise a complementary pair of MOS transistors including P-channel MOS transistor 88 and N-channel MOS transistor 90 connected in series between power supply rails 68 and 74. The gate of P-channel MOS transistor 88 is connected to a control node $V_H$ and the gate of N-channel MOS transistor 90 is connected to a control node $V_L$. The common connection between the drains of P-channel MOS transistor 88 and N-channel MOS transistor 90 is connected to one of column-sum lines 16-1 to 16-3.

Referring now to FIG. 7b, a table shows the voltages which are to be applied to control nodes $V_H$ and $V_L$ to achieve the various operating modes of the circuit. For normal circuit operation, control node $V_H$ is held at a positive voltage potential of 5 volts, and control node $V_L$ is held at a potential of 0 volts. Under these conditions, both transistors 88 and 90 will be off and the column-sum line 16 will be free from the influence of this circuit and carry the sum of the currents from the outputs of the synaptic elements. For tunneling to take place, both control nodes $V_H$ and $V_L$ are held at a positive voltage potential of 5 volts. Under these conditions, transistor 88 is off and transistor 90 is turned on, holding the column-sum line 16 at 0 volts. During current injection mode, both control nodes $V_H$ and $V_L$ are held at a voltage potential of 0 volts. Under these conditions, transistor 88 is turned on and transistor 90 is turned off, holding the column-sum line 16 at 5 volts.

Referring now to FIG. 8, a schematic diagram of a typical high-voltage driver circuit 30 suitable for use with the present invention is shown. The function of high-voltage driver circuits 30-1 to 30-3 in the array of FIG. 1 is to drive tunneling lines 20-1 to 20-3 to a low voltage during normal array operation and to drive selected tunneling lines to high voltages to partially select synapses connected to them for electron tunneling. High voltage driver circuit may comprise a circuit including a current mirror formed from a first P-channel MOS transistor 92 and a second P-channel MOS transistor 94. First P-channel MOS transistor 92 has its source connect ed to a high-voltage voltage rail 96 and its drain and gate connected together to the g ate of second P-channel MOS transistor 94. The source of second P-channel MOS transistor 94 is also connected to high voltage rail 96.

The drain of first P-channel MOS transistor 92 is connected to the drain of an N-channel MOS transistor 98, having its source connected to voltage rail 68 and its gate connected to a control node TUN (the same node as the circuit of FIG. 6a). Second P-channel MOS transistor 94 has its drain connected to the drain of an N-channel MOS transistor 100, having its source connected to voltage rail 68 and its gate connected to the complement of control signal TUN. In FIG. 8, this connection is shown made through an inverter 102 connected to the gate of N-channel MOS transistor 98. The common drain connection of MOS transistors 94 and 100 is connected to one of tunneling-control lines 20-1 to 20-3. As will be appreciated by those of ordinary skill in the art, P-channel MOS transistor 94, and N-channel MOS transistors 98 and 100 may be fabricated as lightly-doped-drain (LDD) devices to withstand the high voltage (typically about 15 volts).

When control node TUN is low, P-channel MOS transistor 92 is turned off, thus denying any driving current to the driving transistor of the current mirror. Furthermore, N-channel MOS transistor 100 is turned on, thus effectively holding the tunneling-control line at ground. When control node TUN is high, N-channel MOS transistor 98 is turned on, allowing the current mirror to function. N-channel MOS transistor 100 is turned off through inverter 102, thus allowing the tunneling control line 20 to be held at a high voltage sufficient to induce electron tunneling.

From the foregoing descriptions, those of ordinary skill in the art will recognize that the voltages on the floating gates of the individual synapses in the synaptic array of the present invention may be individually altered by electron tunneling or injection, and also that tunneling or injection may be simultaneously enabled for all floating gates of all synapses, by placing appropriate control voltages at the appropriate control nodes. To induce simultaneous electron tunneling at all tunneling nodes, the TUN, $V_H$, $V_L$, $D_H$, and $D_L$ signals for all row-programming circuits 24, column-programming circuits 26, and high-voltage driver circuits 30 are brought high. To induce simultaneous electron injection to all floating gates, the TUN, $V_H$, $V_L$, $D_H$, and $D_L$ signals for all row-programming circuits 24, column-programming circuits 26, and high-voltage driver circuits 30 are brought low.

As previously noted, electron injection to the floating gates may be caused by injecting minority carriers into p-well 50 by forward biasing p-well 50 with respect to substrate 52. Forward biasing p-well 50 with respect to substrate 52 may be caused by biasing p+ diffusion region 54, located in p-well 50, to a voltage of about +0.7 volts above substrate 52, as shown symbolically in FIG. 3 by battery symbol 56. There are numerous well-known ways to provide such biasing, such as providing access to the p+ region 54 from an I/O pin of the integrated circuit and applying an appropriate voltage potential to the I/O pin.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an array of N-channel MOS transistors formed in a p-type substrate, said N-channel MOS transistors each including a drain electrode, a source electrode, a control gate and a floating gate on which electrons may be stored to establish a floating gate potential, said array arranged in rows and columns and having a unique row line associated with each row of said array and a unique column line associated with each column of said array, said source electrodes of all of said N-channel MOS transistors in a row connected to said unique row line associated with that row and said drain electrodes of all of said N-channel MOS transistors in a column are connected to said unique column line associated with said column, a method for selectively decreasing said floating gate potential of a selected one of one of said N-channel MOS transistors comprising the steps of:

injecting minority electrons into said substrate;

applying a positive potential of at least 3.2 volts to the one of said row lines and the one of said column lines associated with said selected one of said N-channel MOS transistors while simultaneously maintaining all other ones of said row and column lines at voltages less than less than about 1.5 volts.

2. A method of increasing a weight value associated with a synaptic element with a synaptic array, said synaptic element including an N-channel MOS transistor having a floating gate having a tunneling junction with a tunneling electrode, a source, and a drain, said method comprising:

removing electrons from the synaptic element by driving the floating gate to a negative power-supply rail voltage used by the synaptic array and driving the tunneling electrode to a positive potential sufficient to induce electron tunneling in the synaptic element.

3. The method of claim 2, wherein said positive potential is at least 15 volts. (p. 15, line 15).

4. A method of increasing a weight value associated with a synaptic element, said method comprising:

driving a first gate line to a negative power-supply rail voltage used by a synaptic array;

driving a first tunneling line to a positive voltage potential sufficient to induce electron tunneling in the synaptic element;

driving a second gate line to a positive power-supply rail voltage used by said synaptic array;

driving a second tunneling line to a voltage potential which is insufficient to induce electron tunneling in a second N-channel MOS transistor having a tunneling electrode coupled to said second tunneling line;

wherein the synaptic element is comprised of a first N-channel MOS transistor having a floating gate coupled to said first gate line, a tunneling electrode coupled to said first tunneling line, a source and a drain; and wherein said synaptic array includes a third N-channel MOS transistor having a floating gate coupled to said second gate line, and a tunneling electrode coupled to said first tunneling line.

5. The method of claim 4, wherein said synaptic array includes a third N-channel MOS transistor having a floating gate and a tunneling electrode, said floating gate coupled to said first gate line and said tunneling electrode coupled to a second tunneling line.

6. The method of claim 4, wherein said voltage potential is less than said positive voltage potential.

7. A method of decreasing a weight value associated with a synaptic element, said method comprising:

injecting electrons to the synaptic element by driving a source and a drain which are associated with the synaptic element to a positive potential sufficient to induce electron injection, wherein the synaptic element is comprised of an N-channel MOS transistor having said source, said drain, a floating gate and a tunneling electrode, the synaptic element associated with a set synaptic elements that each have a source, a drain, a floating gate, and a tunneling electrode, the synaptic element and said set of synaptic elements forming an array of synaptic elements; and driving low said source and said drain corresponding to each of said set of synaptic elements.

8. The method of claim 7, wherein said positive potential sufficient to induce electron injection is at least between 3.2 volts and a positive power-supply rail voltage used by said array of synaptic elements.

9. A method of decreasing a weight value associated with a synaptic element, said method comprising:

driving a first row line and a first column-sum line to said positive voltage potential;

driving a second row line and a second column-sum line to a voltage potential less than said positive voltage potential; and wherein the synaptic element is comprised of a first N-channel MOS transistor having a source coupled to said first row line, a drain coupled to said first column-sum line, a floating gate and a tunneling electrode, the synaptic element associated with a synaptic array, said synaptic array having a second N-channel MOS transistor having a source coupled to said second row line, a drain coupled to said second column-sum line, a tunneling electrode, and a floating gate.

10. The method of claim 9 wherein said positive voltage potential is at least 3.2 volts.

11. The method of claim 9 wherein said voltage potential is less than 1.5 volts.

* * * * *